United States Patent
Ho et al.

(10) Patent No.: US 8,791,848 B2
(45) Date of Patent: Jul. 29, 2014

(54) SIGMA-DELTA MODULATORS WITH EXCESS LOOP DELAY COMPENSATION

(71) Applicant: MediaTek Inc., Hsin-Chu (TW)

(72) Inventors: Chen-Yen Ho, New Taipei (TW); Chi-Lun Lo, Yangmei Township, Taoyuan County (TW); Hung-Chieh Tsai, Tainan (TW); Yu-Hsin Lin, Taipei (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 13/760,379

(22) Filed: Feb. 6, 2013

(65) Prior Publication Data

US 2013/0214951 A1    Aug. 22, 2013

Related U.S. Application Data

(60) Provisional application No. 61/601,962, filed on Feb. 22, 2012.

(51) Int. Cl.
*H03M 3/00* (2006.01)

(52) U.S. Cl.
CPC .............. *H03M 3/458* (2013.01); *H03M 3/37* (2013.01); *H03M 3/454* (2013.01)
USPC ........... 341/143; 341/155; 341/118; 341/120

(58) Field of Classification Search
CPC ..................................................... H03M 3/00
USPC .................................. 341/155, 143, 118, 120
See application file for complete search history.

(56) References Cited

U.S. PATENT DOCUMENTS

| | | | | |
|---|---|---|---|---|
| 6,016,112 A * | 1/2000 | Knudsen | ................ | 341/118 |
| 6,583,742 B1 * | 6/2003 | Hossack | ................ | 341/144 |
| 7,358,881 B2 * | 4/2008 | Melanson | ................ | 341/144 |
| 7,362,252 B1 * | 4/2008 | Pai | ................ | 341/143 |
| 7,821,434 B2 * | 10/2010 | Huppertz | ................ | 341/120 |
| 7,944,385 B2 * | 5/2011 | Le Guillou | ................ | 341/143 |
| 2002/0149508 A1 * | 10/2002 | Hamashita | ................ | 341/172 |
| 2003/0128143 A1 * | 7/2003 | Yap et al. | ................ | 341/143 |
| 2004/0021594 A1 * | 2/2004 | Melanson | ................ | 341/143 |

OTHER PUBLICATIONS

Kauffman, J.G., et al.; "An 8mW 50MS/s Ct ΔΣ Modulator with 81dB SFDR and Digital Background DAC Linearization;" ISSCC Dig. Tech. Papers; pp. 472-473; Feb. 2011.

* cited by examiner

*Primary Examiner* — Jean B Jeanglaude
(74) *Attorney, Agent, or Firm* — McClure, Qualey & Rodack, LLP

(57) ABSTRACT

A sigma-delta modulator is provided for generating a digital output signal. The sigma-delta modulator includes a multi-stage loop filter, a quantizer, and a digital-to-analog converter. The multi-stage loop filter receives an analog input signal and generates an integrated output signal according to the analog input signal. Each stage of the multi-stage loop filter includes a feedback network. The quantizer receives the integrated output signal and quantizes the integrated output signal to generate the digital output signal. The digital-to-analog converter receives the digital output signal and converts the digital output signal to a compensation signal. The digital-to-analog converter provides the compensation signal to a plurality of internal nodes in the feedback network of the last stage of the multi-stage loop filter.

15 Claims, 8 Drawing Sheets

SIGMA-DELTA MODULATORS WITH EXCESS LOOP DELAY COMPENSATION

CROSS REFERENCE TO RELATED APPLICATIONS

This application claims the benefit of U.S. Provisional Application No. 61/601,962, filed on Feb. 22, 2012, the contents of which are incorporated herein by reference.

BACKGROUND OF THE INVENTION

1. Field of the Invention

The invention relates to a sigma-delta modulator, and more particularly, to a continuous-time sigma-delta modulator with excess loop delay compensation.

2. Description of the Related Art

Generally, continuous-time sigma-delta modulators are sensitive to delays in feedback paths. The delays are introduced by a quantizer or any other circuits processing digital output signals, called excess loop delays (ELDs). A delay causes instability of the continuous-time sigma-delta modulators. In prior arts, the effect of the excess loop delay in a continuous-time sigma-delta modulator is compensated with the introduction of a constant term to the transfer function through at least one additional feedback digital-to-analog converter. Depending on the position where the delay compensation is applied, an additional operational amplifier is required for the feedback digital-to-analog converter, or two feedback digital-to-analog converters are required, which increases the area and power consumption of the continuous-time sigma-delta modulator. When the position where the delay compensation is applied is located before a quantizer, an additional pole induced by the feedback digital-to-analog converter may degrade the loop stability. In some other cases, when the position where the delay compensation is applied is at two input terminals of an operational amplifier, the transfer function of the continuous-time sigma-delta modulator may be changed which is disadvantageous to circuit designs.

BRIEF SUMMARY OF THE INVENTION

Thus, it is desirable to provide a sigma-delta modulator which can compensate for an excess loop delay without negatively affecting the transfer function and stability of the sigma-delta modulator.

An exemplary embodiment of a sigma-delta modulator is provided for generating a digital output signal. The sigma-delta modulator comprises a multi-stage loop filter, a quantizer, and a digital-to-analog converter. The multi-stage loop filter receives an analog input signal and generates an integrated output signal according to the analog input signal. Each stage of the multi-stage loop filter comprises a feedback network. The quantizer receives the integrated output signal and quantizes the integrated output signal to generate the digital output signal. The digital-to-analog converter receives the digital output signal and converts the digital output signal to a compensation signal. The digital-to-analog converter provides the compensation signal to a plurality of internal nodes in the feedback network of the last stage of the multi-stage loop filter to compensate.

An exemplary embodiment of a method for converting an analog signal into a digital signal is provided. The method comprises generating an integrated output signal according to a received analog input signal by a multi-stage loop filter of a sigma-delta modulator, quantizing the integrated output signal to generate a digital output signal by a quantizer of the sigma-delta modulator, converting the digital output signal to a compensation signal, and providing the compensation signal to internal nodes in a feedback network of a last stage of the multi-stage loop filter.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
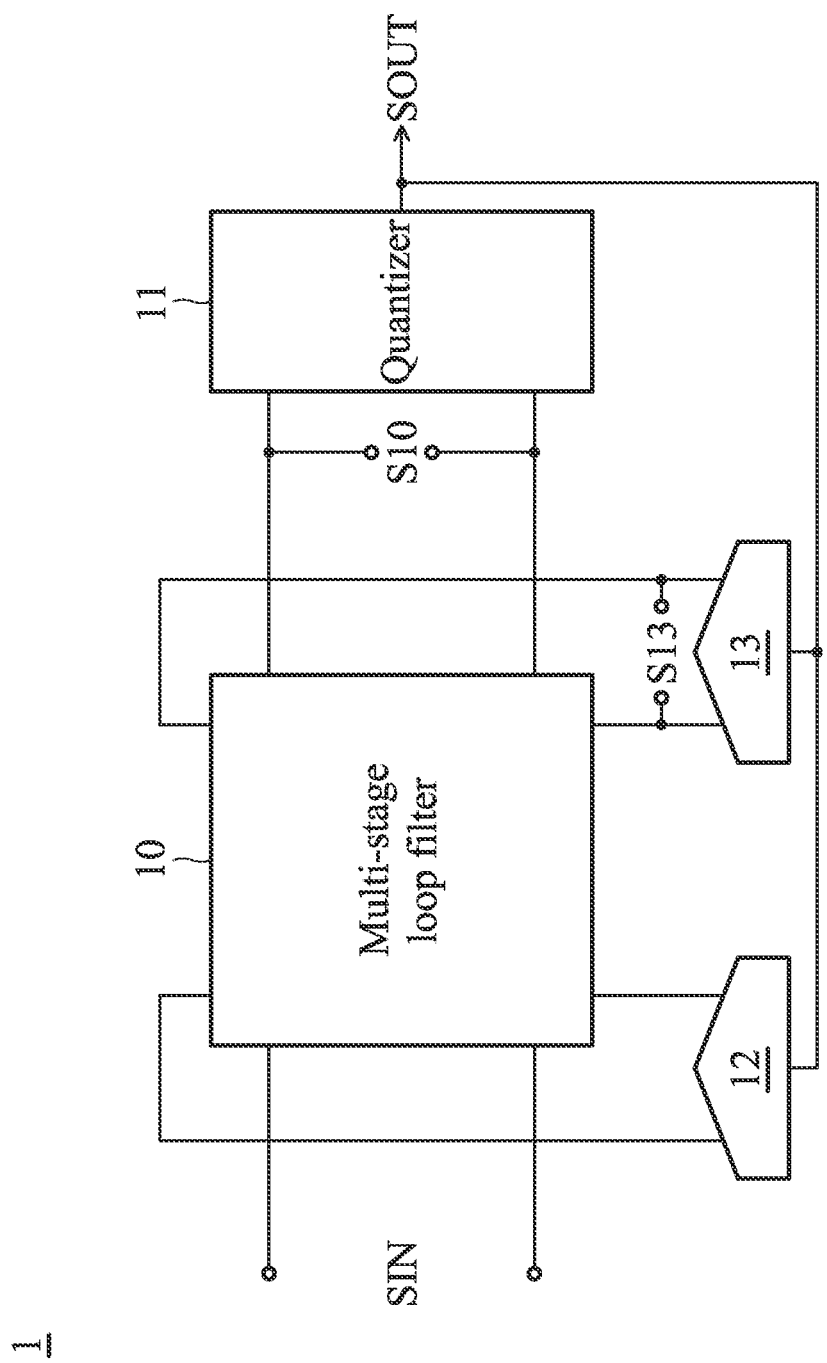
FIG. 1 shows an exemplary embodiment of a sigma-delta modulator.

FIG. 1 shows an exemplary embodiment of a sigma-delta modulator. Referring to FIG. 1, the sigma-delta modulator 1 comprises a multi-stage loop filter 10, a quantizer 11, and digital-to-analog converters (DACs) 12 and 13. The multi-stage loop filter 10 receives an analog input signal SIN and performs an integration operation to the analog input signal SIN to generate an integrated output signal S10. The quantizer 11 receives the integrated output signal S10 and quantizes the integrated output signal S10 to generate a digital output signal SOUT. The digital output signal SOUT is transmitted to external circuits for digital processing. The digital output signal SOUT is also transmitted to the DAC 12 which converts the digital output signal SOUT back to an analog signal for the multi-stage loop filter 10. Accordingly, the sigma-delta modulator 1 operates as a closed loop. The DAC 13 receives the digital output signal SOUT and converts the digital output signal SOUT to an analog compensation signal S13.

In the multi-stage loop filter 10 of the embodiment, there are a plurality of stages of integrator circuits. Each of the stages of the integrator circuit comprises a feedback network. For the last stage of the integrator circuits, the feedback network comprises a plurality of impedance circuits. The DAC 13 provides the compensation signal S13 to a plurality of internal nodes, and each internal node is located between two coupled impedance circuits. The DAC 13 introduces a constant term to the transfer function of the multi-stage loop filter 10 through the compensation signal S13. By the introduction of the constant term, the excess loop delay of the sigma-delta modulator 1 can be compensated for.

Figure 2:
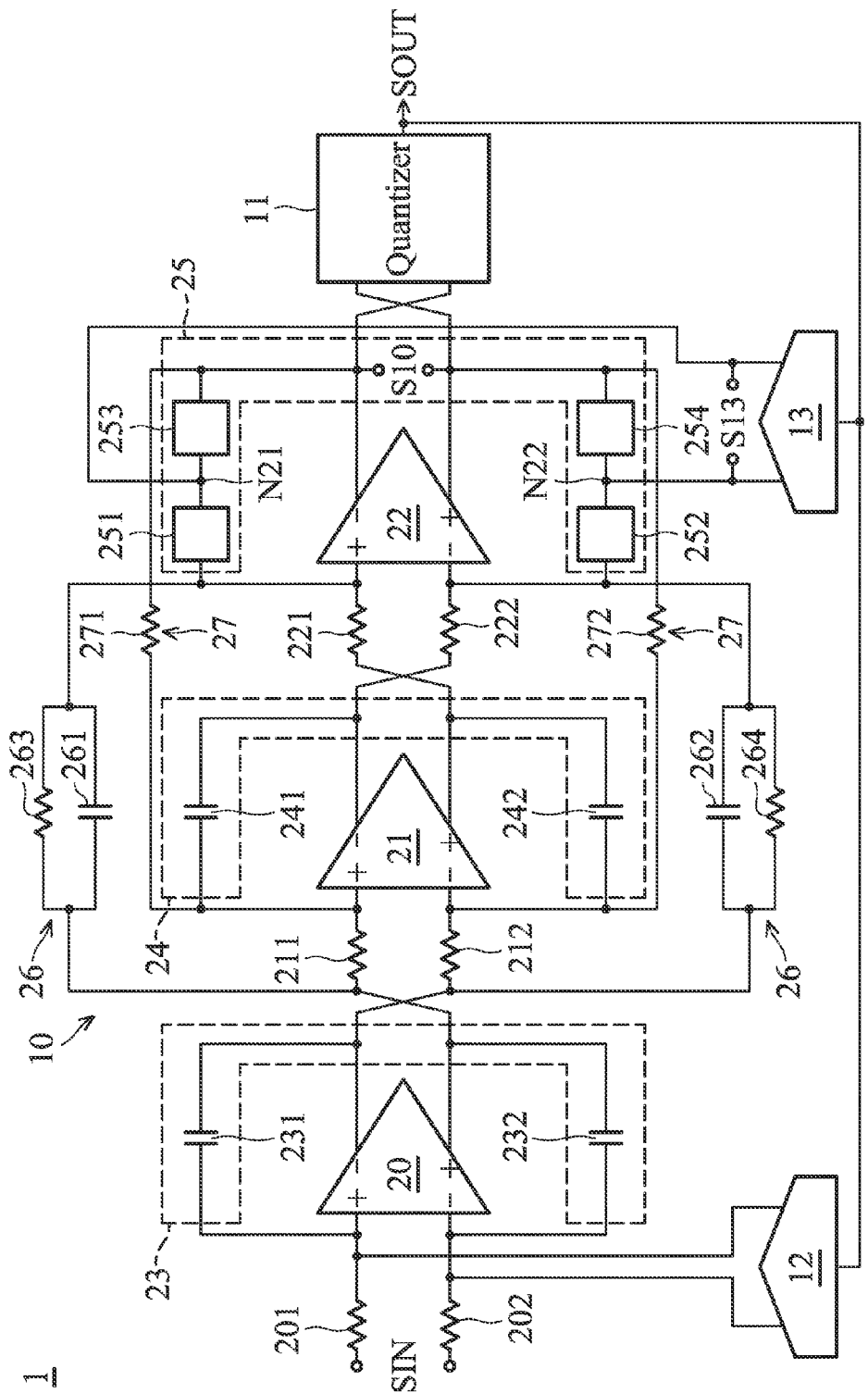
FIG. 2 shows an exemplary embodiment of a multi-stage loop filter in a sigma-delta modulator.

In an embodiment, the sigma-delta modulator 1 is a fully-differential modulator. In other words, the multi-stage loop filter 10 is implemented by differential operational amplifiers. Referring to FIG. 2, a three-stage loop filter is given as an example for the multi-stage loop filter 10. For the multi-stage loop filter 10, three stages of integrator circuits are given as an example. The multi-stage loop filter 10 comprises operational amplifiers 20-22, resistors 201-202, 211-212, and 221-222, and feedback networks 23-27. Each of the operational amplifiers 20-22 has a positive (+) input terminal, a negative (−) input terminal, a positive output terminal, and a negative output terminal. The one terminal of the resistor 201 receives the analog input signal SIN, and the other terminal thereof is coupled to the positive input terminal of the operational amplifier 20. The one terminal of the resistor 202 receives the analog input signal SIN, and the other terminal thereof is coupled to the negative input terminal of the operational amplifier 20. The feedback network 23 comprises capacitors 231 and 232. The capacitor 231 is coupled between the positive input terminal and the negative output terminal of the operational amplifier 20, and the capacitor 232 is coupled between the negative input terminal and the positive output terminal of the operational amplifier 20. The resistors 201 and 202, the operational amplifier 20, and the feedback network 23 form one stage of the multi-stage loop filter 10; that is the first stage among the three stages of the integrator circuits.

The one terminal of the resistor 211 is coupled to the positive output terminal of the operational amplifier 20, and the other terminal thereof is coupled to the positive input terminal of the operational amplifier 21. The one terminal of the resistor 212 is coupled to the negative output terminal of the operational amplifier 20, and the other terminal thereof is coupled to the negative input terminal of the operational amplifier 21. The feedback network 24 comprises capacitors 241 and 242. The capacitor 241 is coupled between the positive input terminal and the negative output terminal of the operational amplifier 21, and the capacitor 242 is coupled between the negative input terminal and the positive output terminal of the operational amplifier 21. The resistors 211 and 212, the operational amplifier 21, and the feedback network 24 form one stage of the multi-stage loop filter 10; that is the second stage among the three stages of the integrator circuits.

The one terminal of the resistor 221 is coupled to the positive output terminal of the operational amplifier 21, and the other terminal thereof is coupled to the positive input terminal of the operational amplifier 22. The one terminal of the resistor 222 is coupled to the negative output terminal of the operational amplifier 21, and the other terminal thereof is coupled to the negative input terminal of the operational amplifier 22. The feedback network 25 comprises impedance circuits 251-254. The resistors 221 and 222, the operational amplifier 22, and the feedback network 25 form one stage of the multi-stage loop filter 10; that is the last stage (the third stage) among the three stages of the integrator circuits. For the last stage of the integrator circuits, the positive and negative input terminals of the operational amplifier 22 serve as the two input nodes of the last stage of the integrator circuits, and the positive and negative output terminals thereof serve as two output nodes of the last stage of the integrator circuits. The feedback network 26 comprises capacitors 261 and 262 and resistors 263 and 264. The capacitor 261 and the resistor 263 are coupled in parallel between the positive output terminal of the operational amplifier 20 and the positive input terminal of the operational amplifier 22. The capacitor 262 and the resistor 264 are coupled in parallel between the negative output terminal of the operational amplifier 20 and the negative input terminal of the operational amplifier 22. The feedback network 27 comprises resistors 271 and 272. The resistor 271 is coupled between the positive input terminal of the operational amplifier 21 and the negative output terminal of the operational amplifier 22, and the resistor 272 is coupled between the negative input terminal of the operational amplifier 21 and the positive output terminal of the operational amplifier 22.

In the embodiment, for example, there are two internal nodes between the impedance circuits 251-254 in the feedback network 25. Referring to FIG. 2, the impedance circuits 251 and 253 are coupled in series between the positive input terminal and the negative output terminal of the operational amplifier 22, and the impedance circuits 252 and 254 are coupled between the negative input terminal and the positive output terminal of the operational amplifier 22. Among the two internal nodes in the feedback circuit 25, one internal node N21 is at the joint between the impedance circuits 251 and 253, and the other internal node N22 is at the joint between the impedance circuits 252 and 244. Accordingly, the impedance circuit 251 is coupled between the positive input terminal of the operational amplifier 22 and the internal node N21, and the impedance circuit 253 is coupled between the internal node N21 and the negative output terminal of the operational amplifier 22. The impedance circuit 252 is coupled between the negative input terminal of the operational amplifier 22 and the internal node N22, and the impedance circuit 254 is coupled between the internal node N22 and the positive output terminal of the operational amplifier 22. The DAC 13 provides the compensation signal S13 to the internal nodes N21 and N22 to introduce a constant term to the transfer function of the multi-stage loop filter 10. Thus, the path passing through the DAC 13 is a compensation path for excess loop delay.

According to the embodiment, the last stage of the integrator circuits of the multi-stage loop filter 10 is close to the quantizer 11, and, thus, the compensation path is the fast path for the introduction of the constant term. Referring to FIG. 2, the position where the compensation is applied is at the internal nodes N21 and N22 in the feedback network 25 of the last stage of the integrator circuits rather than at the inputs of the operational amplifier 22. Thus, the transfer function of the continuous-time sigma-delta modulator 1 may not be changed. Moreover, since the input equivalent capacitance of the quantizer 11 is small, an additional pole introduced by the input capacitance is at the high frequency larger than two or three times that of the sampling rate of the sigma-delta modulator 1. Accordingly, especially at high speeds, the stability of the sigma-delta modulator 1 would not be affected by the additional pole.

In the embodiment, the analog input signal SIN is a differential signal, and it is preferable that the differential paths are provided in the sigma-delta modulator 1 for the analog input signal SIN. Thus, the resistance values of the resistors 201 and 202 are equal, the resistance values of the resistors 211 and 212 are equal, the resistance values of the resistors 221 and 222 are equal, the resistance values of the resistors 263 and 264 are equal, and the resistance values of the resistors 271 and 272 are equal. Moreover, the capacitance values of the capacitors 231 and 232 are equal, the capacitance values of the capacitors 241 and 242 are equal, and the capacitance values of the capacitors 261 and 262 are equal.

Figure 3:
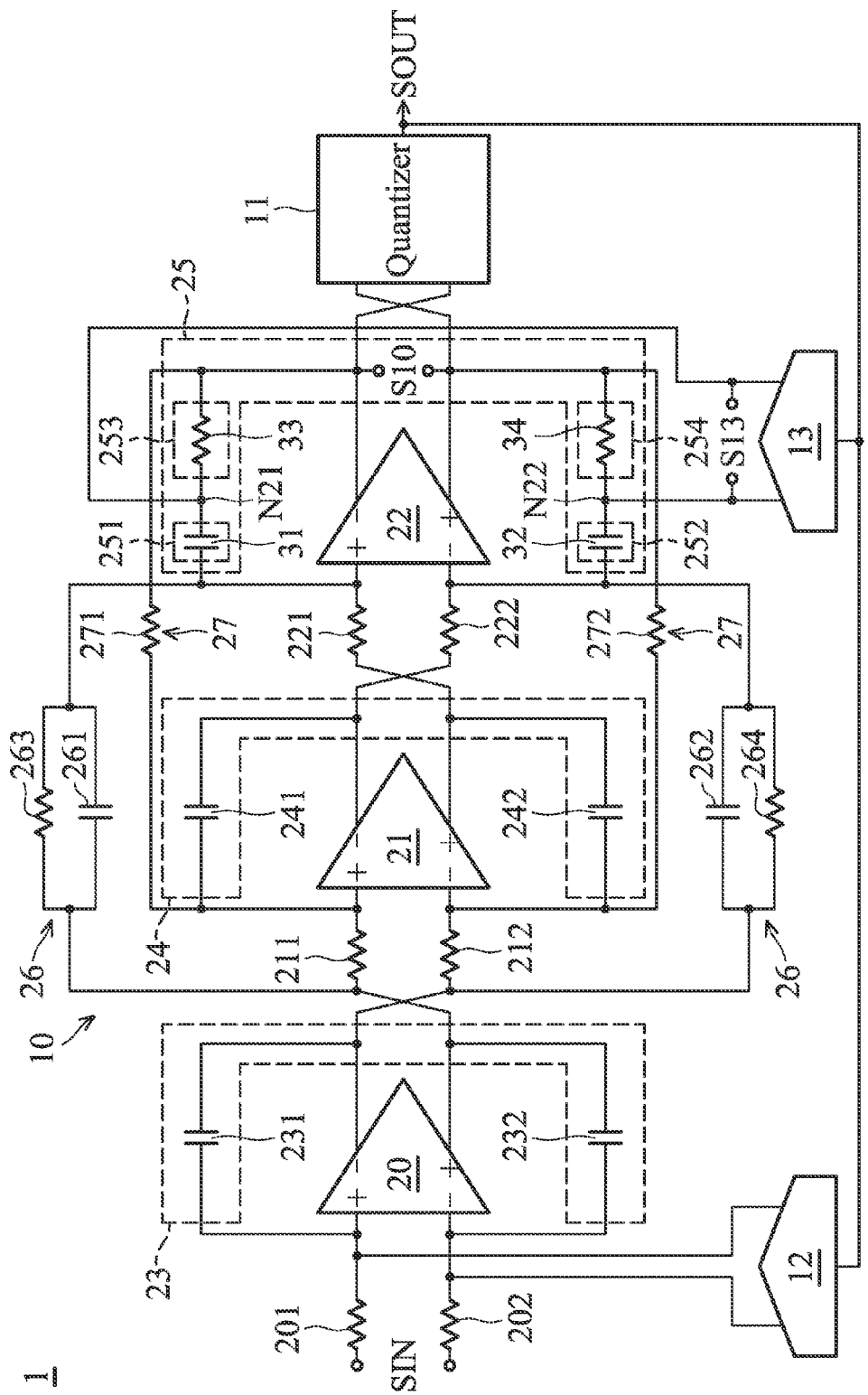
FIGS. 3-4 show exemplary embodiments of a feedback network of the last stage of a multi-stage loop filter.

In the embodiment, among the impedance circuits 251 and 253, one comprises a resistor, and the other one comprises a capacitor. Among the impedance circuits 252 and 254, one comprises a resistor, and the other one comprises a capacitor. FIG. 3 shows one exemplary embodiment of the impedances 251-254 in the feedback network 25. As shown in FIG. 3, the impedance circuit 251 comprises a capacitor 31, and the impedance circuit 253 comprises a resistor 33. The capacitor 31 is coupled between the positive input terminal of the operational amplifier 22 and the internal node N21, and the resistor 33 is coupled between the internal node N21 and the negative output terminal of the operational amplifier 22. The impedance circuit 252 comprises a capacitor 32, and the impedance circuit 254 comprises a resistor 34. The capacitor 32 is coupled between the negative input terminal of the operational amplifier 22 and the internal node N22, and the resistor 34 is coupled between the internal node N22 and the positive output terminal of the operational amplifier 22. According to the structure of the feedback network in FIG. 3, the direct current of the DAC 13 can be provided by the positive and negative output terminals of the operational amplifier 22 through the resistors 33 and 34 without direct current provided by the operational amplifier 21 of the second stage with less driving capability.

Figure 4:
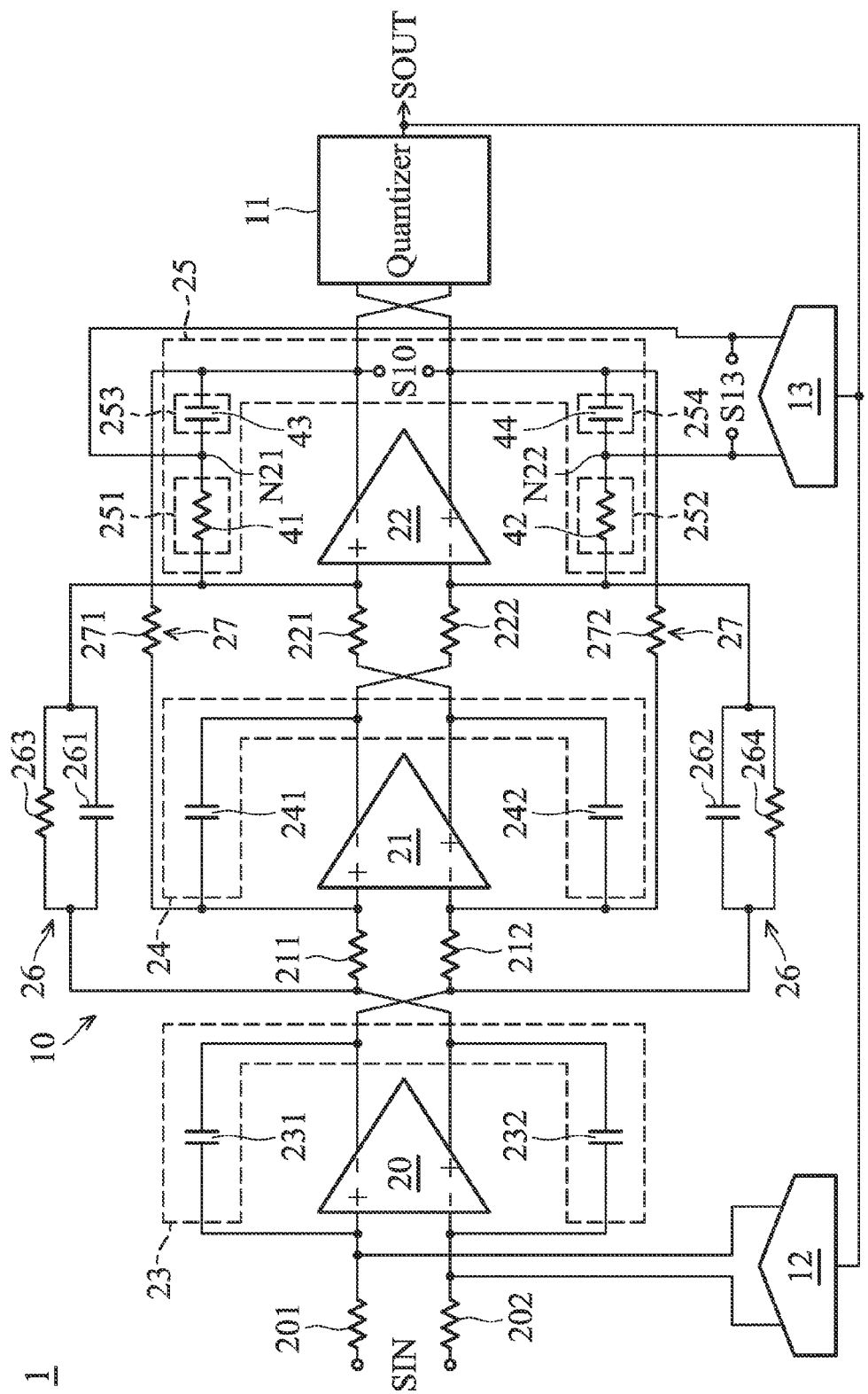

FIG. 4 shows another exemplary embodiment of the impedances 251-254 in the feedback network 25. As shown in FIG. 4, the impedance circuit 251 comprises a resistor 41, and the impedance circuit 253 comprises a capacitor 43. The resistor 41 is coupled between the positive input terminal of the operational amplifier 22 and the internal node N21, and the capacitor 43 is coupled between the internal node N21 and the negative output terminal of the operational amplifier 22. The impedance circuit 252 comprises a resistor 42, and the impedance circuit 254 comprises a capacitor 44. The resistor 42 is coupled between the negative input terminal of the operational amplifier 22 and the internal node N22, and the capacitor 44 is coupled between the internal node N22 and the positive output terminal of the operational amplifier 22.

In the above embodiment, the structure of the multi-stage loop filter 10 is an example using three stages of integrator circuits. In some embodiments, the structure of the multi-stage loop filter 10 is determined according to the expected number of stages of integrator circuits. Moreover, the feedback network 25 of the last stage of the integrator circuits may comprise more impedance circuits. The number of the internal nodes of the feedback network 25 therefore may be larger than two. In this case, the DAC 13 is able to provide the compensation signal S13 to any pair of the internal nodes in the feedback network 25 of the last stage of the integrator circuits for excess loop delay compensation.

Figure 5:
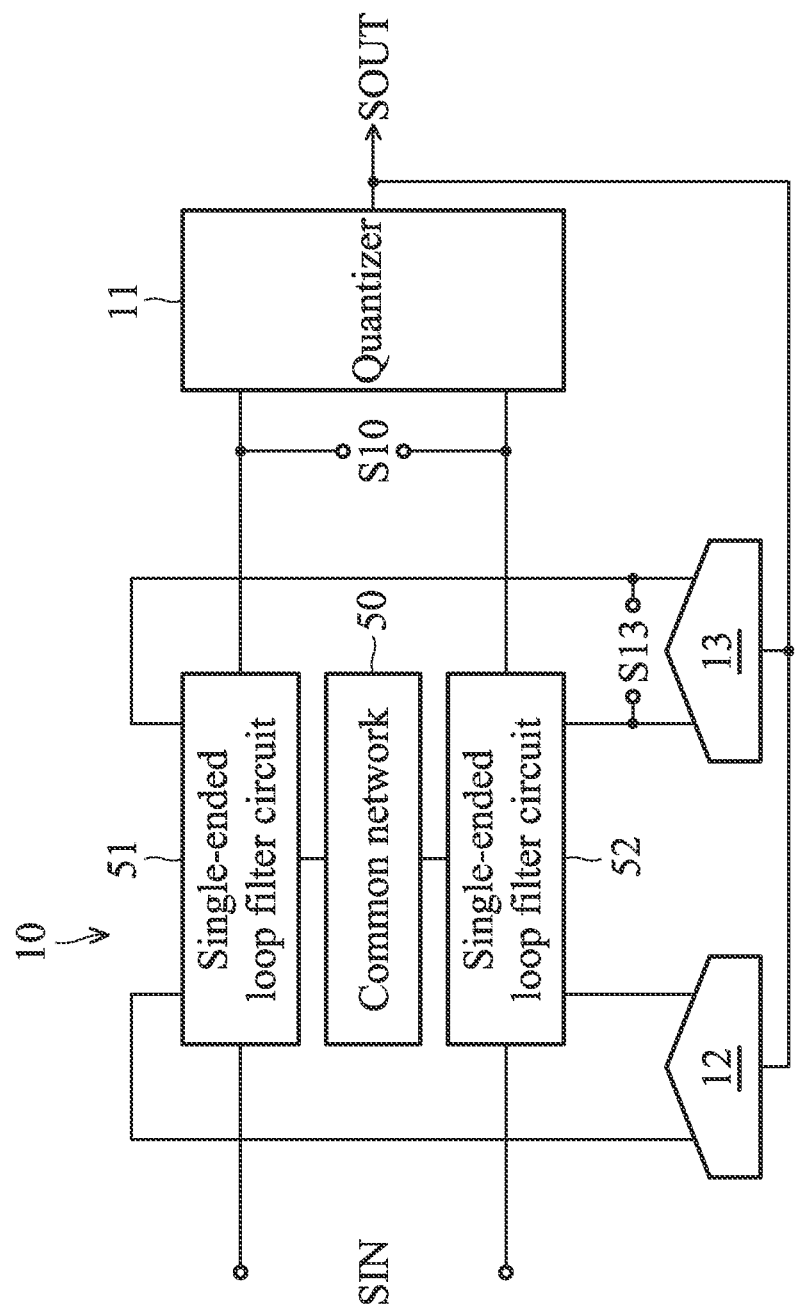
FIG. 5 shows another exemplary embodiment of a multi-stage loop filter in a sigma-delta modulator.
Figure 6:
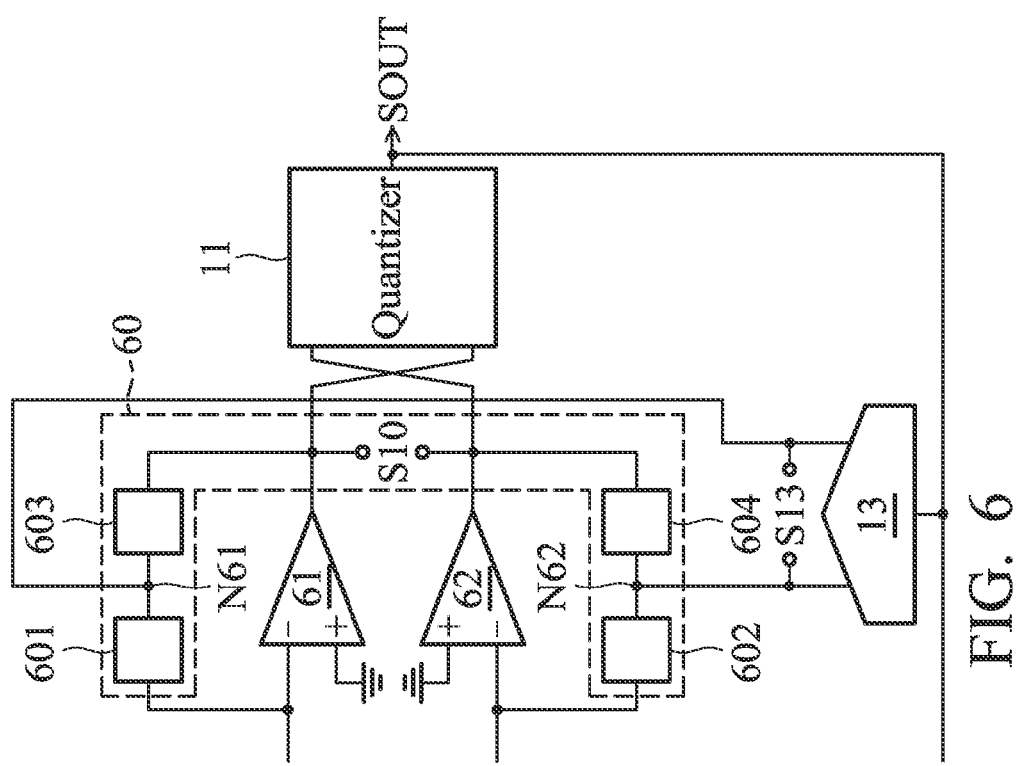
FIGS. 6-8 show exemplary embodiments of a feedback network of the last stage of a multi-stage loop filter.

In another embodiment, the sigma-delta modulator 1 is a pseudo-differential modulator. In other words, the multi-stage loop filter 10 is implemented by single-ended operational amplifiers. Referring to FIG. 5, the multi-stage loop filter 10 comprises a common network 50 and single-ended loop filter circuits 51 and 52. The common network 50 is coupled between the single-ended loop filter circuits 51 and 52 for communication therebetween. The single-ended loop filter circuits 51 and 52 work together through the common network 50 to form a plurality of stages of integrator circuits implemented by single-ended operational amplifiers. The DAC 13 provides the compensation signal S13 to a plurality of internal nodes in the feedback network of the last stage of the integrator circuits to introduce a constant term to the transfer function of the transfer function of the multi-stage loop filter 10 for the compensation of the excess loop delay. Referring to FIG. 6, the last stage of the integrator circuits comprises operational amplifiers 61 and 62 and a feedback network 60. Each of the operational amplifiers 61 and 62 has a positive (+) input terminal, a negative (−) input terminal, and an output terminal. For the last stage of the integrator circuits, the negative input terminals of the operational amplifiers 61 and 62 serve as the two input nodes of the last stage of the integrator circuits, and the output terminals thereof serve as two output nodes of the last stage of the integrator circuits. The positive input terminals of the operational amplifiers 61 and 62 are coupled to a reference ground. The feedback network 60 comprises impedance circuits 601-604

In the embodiment, for example, there are two internal nodes between the impedance circuits 601-604 in the feedback network 60, as shown in FIG. 6. For clarity, FIG. 6 shows only the quantizer 11, the DAC 13, the operational amplifiers 61 and 62, and the feedback network 60. Referring to FIG. 6, the impedance circuits 601 and 603 are coupled in series between the negative input terminal and the output terminal of the operational amplifier 61, and the impedance circuits 602 and 604 are coupled between the negative input terminal and the output terminal of the operational amplifier 62. Among the two internal nodes in the feedback circuit 60, one internal node N61 is at the joint between the impedance circuits 601 and 603, and the other internal node N62 is at the joint between the impedance circuits 602 and 604. Accordingly, the impedance circuit 601 is coupled between the negative input terminal of the operational amplifier 61 and the internal node N61, and the impedance circuit 603 is coupled between the internal node N61 and the output terminal of the operational amplifier 61. The impedance circuit 602 is coupled between the negative input terminal of the operational amplifier 62 and the internal node N62, and the impedance circuit 604 is coupled between the internal node N62 and the output terminal of the operational amplifier 62. The DAC 13 provides the compensation signal S13 to the internal nodes N61 and N62.

Figure 7:
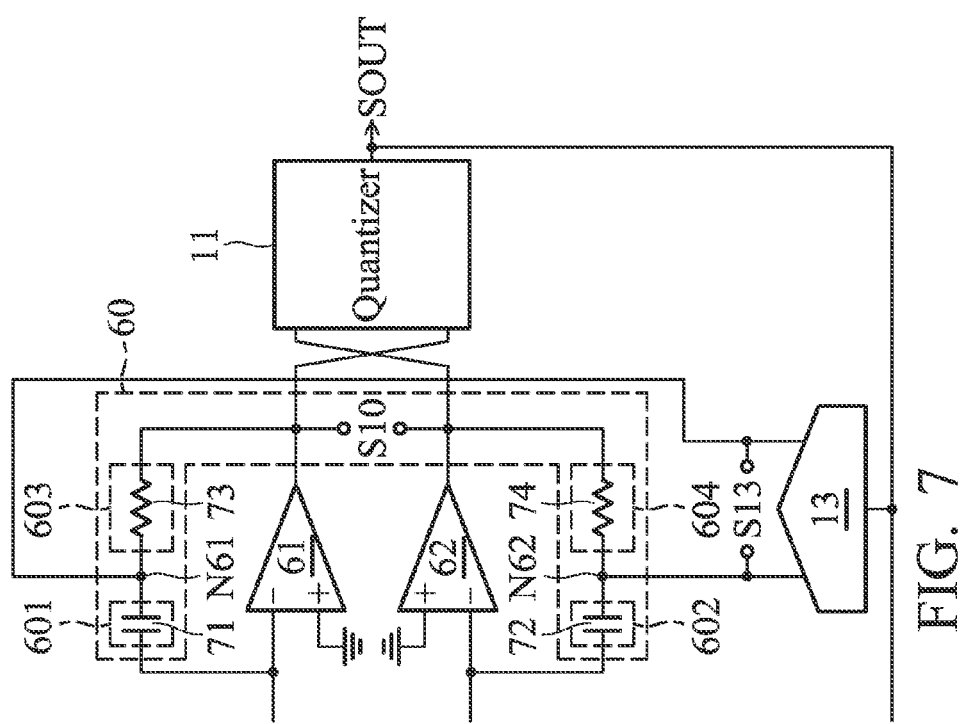

In the embodiment of FIG. 6, among the impedance circuits 601 and 603, one comprises a resistor, and the other one comprises a capacitor. Among the impedance circuits 602 and 604, one comprises a resistor, and the other one comprises a capacitor. FIG. 7 shows one exemplary embodiment of the impedances 601-604 in the feedback network 60. As shown in FIG. 7, the impedance circuit 601 comprises a capacitor 71, and the impedance circuit 603 comprises a resistor 73. The capacitor 71 is coupled between the negative input terminal of the operational amplifier 61 and the internal node N61, and the resistor 73 is coupled between the internal node N61 and the output terminal of the operational amplifier 61. The impedance circuit 602 comprises a capacitor 72, and the impedance circuit 604 comprises a resistor 74. The capacitor 72 is coupled between the negative input terminal of the operational amplifier 62 and the internal node N62, and the resistor 74 is coupled between the internal node N62 and the output terminal of the operational amplifier 62. According to the structure of the feedback network in FIG. 7, the direct current of the DAC 13 can be provided by the output terminals of the operational amplifiers 61 and 62 through the resistors 73 and 74 without direct current provided by the operational amplifiers of the previous stage with less driving capability.

Figure 8:
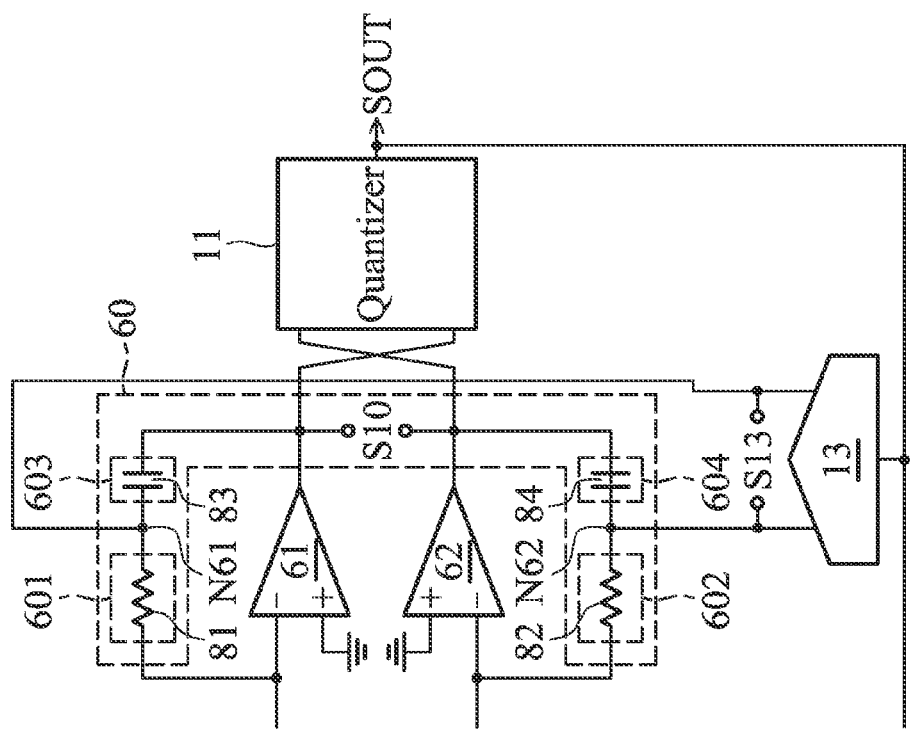

FIG. 8 shows another exemplary embodiment of the impedances 601-604 in the feedback network 60. As shown in FIG. 8, the impedance circuit 601 comprises a resistor 81, and the impedance circuit 603 comprises a capacitor 83. The resistor 81 is coupled between the negative input terminal of the operational amplifier 61 and the internal node N61, and the capacitor 83 is coupled between the internal node N61 and the output terminal of the operational amplifier 61. The impedance circuit 602 comprises a resistor 82, and the impedance circuit 604 comprises a capacitor 84. The resistor 82 is coupled between the negative input terminal of the operational amplifier 62 and the internal node N62, and the capacitor 84 is coupled between the internal node N62 and the output terminal of the operational amplifier 62.

Similar to the embodiment given above, the structure of the multi-stage loop filter 10 is not limited to three stages. In some embodiments, the structure of the multi-stage loop filter 10 is determined according to the expected number of stages of integrator circuits. Moreover, the feedback network 60 of the last stage of the integrator circuits may comprise more than four impedance circuits. The number of the internal nodes of the feedback network 60 therefore may be larger than two. In this case, the DAC 13 is able to provide the compensation signal S13 to any pair of the internal nodes in the feedback network 60 of the last stage of the integrator circuits for excess loop delay compensation.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A sigma-delta modulator for generating a digital output signal, comprising:
    a multi-stage loop filter for receiving an analog input signal and generating an integrated output signal according to the analog input signal, wherein each stage of the multi-stage loop filter comprises a feedback network;
    a quantizer for receiving the integrated output signal and quantizing the integrated output signal to generate the digital output signal; and
    a digital-to-analog converter for receiving the digital output signal and converting the digital output signal to a compensation signal,
    wherein the digital-to-analog converter provides the compensation signal to a plurality of internal nodes in the feedback network of the last stage of the multi-stage loop filter.

2. The sigma-delta modulator as claimed in claim 1,
    wherein the last stage of the multi-stage loop filter has a first input node, a second input node, a first output node, and a second output node, and the integrated output signal is generated between the first and second output nodes, and
    wherein the feedback network of the last stage of the multi-stage loop filter comprises:
    a first impedance circuit and a second impedance circuit coupled in series between the first input node and the first output node of the last stage of the multi-stage loop filter; and
    a third impedance circuit and a fourth impedance circuit coupled in series between the second input node and the second output node of the last stage of the multi-stage loop filter,
    wherein the digital-to-analog converter provides the compensation signal to a first internal node between the first and second impedance circuits and a second internal node between the third and fourth impedance circuits.

3. The sigma-delta modulator as claimed in claim 2,
    wherein one of the first and second impedance circuits comprises a first capacitor, and the other of the first and second impedance circuits comprises a first resistor, and
    wherein one of the third and fourth impedance circuits comprises a second capacitor, and the other of the third and fourth impedance circuits comprises a second resistor.

4. The sigma-delta modulator as claimed in claim 3,
    wherein the last stage of the multi-stage loop filter comprises: an operational amplifier having a positive input terminal, a negative input terminal, a positive output terminal, and a negative output terminal coupled to the first input node, the second input node, the second output node, and the first output node of the last stage, respectively;
    wherein the first impedance circuit is coupled between the positive input terminal of the operational amplifier and the first internal node and comprises the first capacitor,
    wherein the second impedance circuit is coupled between the first internal node and the negative output terminal of the operational amplifier and comprises the first resistor,
    wherein the third impedance circuit is coupled between the negative input terminal of the operation amplifier and the second internal node and comprises the second capacitor, and
    wherein the fourth impedance circuit is coupled between the second internal node and the positive output terminal of the operational amplifier and comprises the second resistor.

5. The sigma-delta modulator as claimed in claim 3,
    wherein the last stage of the multi-stage loop filter comprises an operational amplifier having a positive input terminal, a negative input terminal, a positive output terminal, and a negative output terminal coupled to the first input node, the second input node, the second output node, and the first output node of the last stage, respectively;
    wherein the first impedance circuit is coupled between the positive input terminal of the operational amplifier and the first internal node and comprises the first resistor,
    wherein the second impedance circuit is coupled between the first internal node and the negative output terminal of the operational amplifier and comprises the first capacitor,
    wherein the third impedance circuit is coupled between the negative input terminal of the operation amplifier and the second internal node and comprises the second resistor, and
    wherein the fourth impedance circuit is coupled between the second internal node and the positive output terminal of the operational amplifier and comprises the second capacitor.

6. The sigma-delta modulator as claimed in claim 2, wherein the multi-stage loop filter further comprises:
    a first operational amplifier having a positive input terminal coupled to a reference ground, a negative input terminal coupled to the first input node of the last stage, and an output terminal coupled to the first output node of the last stage; and
    a second operational amplifier having a positive input terminal coupled to the reference ground, a negative input terminal coupled to the second input node of the last stage, and an output terminal coupled to the second output node of the last stage.

7. The sigma-delta modulator as claimed in claim 6,
    wherein one of the first and second impedance circuits comprises a first capacitor, and the other of the first and second impedance circuits comprises a first resistor, and
    wherein one of the third and fourth impedance circuits comprises a second capacitor, and the other of the third and fourth impedance circuits comprises a second resistor.

8. The sigma-delta modulator as claimed in claim 7,
    wherein the first impedance circuit is coupled between the negative input terminal of the first operational amplifier and the first internal node and comprises the first capacitor,
    wherein the second impedance circuit is coupled between the first internal node and the output terminal of the first operational amplifier and comprises the first resistor, wherein the third impedance circuit is coupled between the negative input terminal of the second operation amplifier and the second internal node and comprises the second capacitor, and wherein the fourth impedance circuit is coupled between the second internal node and the output terminal of the second operational amplifier and comprises the second resistor.

9. The sigma-delta modulator as claimed in claim 7, wherein the first impedance circuit is coupled between the negative input terminal of the first operational amplifier and the first internal node and comprises the first resistor, wherein the second impedance circuit is coupled between the first internal node and the output terminal of the first operational amplifier and comprises the first capacitor, wherein the third impedance circuit is coupled between the negative input terminal of the second operation amplifier and the second internal node and comprises the second resistor, and wherein the fourth impedance circuit is coupled between the second internal node and the output terminal of the second operational amplifier and comprises the second capacitor.

10. The sigma-delta modulator as claimed in claim 6, wherein multi-stage loop filter further comprises a common network coupled between the first operation amplifier and the second operational amplifier.

11. The sigma-delta modulator as claimed in claim 1, wherein the sigma-delta modulator is implemented by a fully-differential modulator.

12. The sigma-delta modulator as claimed in claim 1, wherein the sigma-delta modulator is implemented by a pseudo-differential modulator.

13. A method for converting an analog signal to a digital signal, comprising:

receiving an analog input signal and generating an integrated output signal according to the analog input signal by a multi-stage loop filter of a sigma-delta modulator;

quantizing the integrated output signal to generate a digital output signal by a quantizer of the sigma-delta modulator;

converting the digital output signal to a compensation signal; and providing the compensation signal to internal nodes in a feedback network of a last stage of the multi-stage loop filter.

14. The method as claimed in claim 13, further comprising:

providing a first impedance circuit and a second impedance circuit coupled in series between a first input node and a first output node of the last stage of the multi-stage loop filter; and providing a third impedance circuit and a fourth impedance circuit coupled in series between a second input node and a second output node of the last stage of the multi-stage loop filter, wherein the compensation signal is provided to a first internal node between the first and second impedance circuits and a second internal node between the third and fourth impedance circuits.

15. The method as claimed in claim 14, wherein one of the first and second impedance circuits comprises a first capacitor, and the other of the first and second impedance circuits comprises a first resistor, and wherein one of the third and fourth impedance circuits comprises a second capacitor, and the other of the third and fourth impedance circuits comprises a second resistor.

\* \* \* \* \*